(12) United States Patent
Akram et al.

(10) Patent No.: US 6,913,997 B2
(45) Date of Patent: Jul. 5, 2005

(54) METHOD OF USING TANTALUM-ALUMINUM-NITROGEN MATERIAL AS DIFFUSION BARRIER AND ADHESION LAYER IN SEMICONDUCTOR DEVICES

(75) Inventors: Salman Akram, Boise, ID (US); Scott G. Meikle, Boise, ID (US)

(73) Assignee: Micron Technology, Inc., Boise, ID (US)

(*) Notice: Subject to any disclaimer, the term of this patent is extended or adjusted under 35 U.S.C. 154(b) by 40 days.

(21) Appl. No.: 10/213,306

(22) Filed: Aug. 6, 2002

(65) Prior Publication Data

US 2002/0197857 A1 Dec. 26, 2002

Related U.S. Application Data

(60) Continuation of application No. 09/207,058, filed on Dec. 7, 1998, now Pat. No. 6,432,818, which is a division of application No. 08/660,849, filed on Jun. 10, 1996, now Pat. No. 5,892,281.

(51) Int. Cl.[7] .............................................. H01L 21/44
(52) U.S. Cl. ........................ 438/653; 438/118; 438/396; 438/697
(58) Field of Search ................................ 438/653, 118, 438/396, 697; 257/758

(56) References Cited

U.S. PATENT DOCUMENTS

| | | |
|---|---|---|
| 4,649,070 A | 3/1987 | Kondo et al. |
| 4,801,067 A | 1/1989 | Kondo et al. |
| 4,920,071 A | 4/1990 | Thomas |
| 4,933,743 A | 6/1990 | Thomas et al. |
| 5,000,818 A | 3/1991 | Thomas et al. |
| 5,117,276 A | 5/1992 | Thomas et al. |
| 5,231,306 A | 7/1993 | Meikle et al. |
| 5,489,548 A | 2/1996 | Nishioka et al. |
| 5,504,041 A | 4/1996 | Summerfelt |
| 5,554,564 A | 9/1996 | Nishioka et al. |
| 5,589,284 A | 12/1996 | Summerfelt et al. |
| 5,793,057 A | 8/1998 | Summerfelt |
| 5,851,896 A | 12/1998 | Summerfelt |
| 5,872,696 A | 2/1999 | Peters et al. |
| 5,892,281 A | 4/1999 | Akram et al. |
| 6,133,636 A | 10/2000 | Akram et al. |
| 6,239,492 B1 | 5/2001 | Meikle et al. |
| 2001/0040293 A1 * | 11/2001 | Meikle et al. ............... 257/751 |

FOREIGN PATENT DOCUMENTS

JP     411111919     4/1999

OTHER PUBLICATIONS

Stanley Wolf, "Silicon Processing for the VLSI Era", vol. II: Process Integration, pps. 121–123.
Rointan F. Bunshah, "Handbook of Deposition Technologies for films and Coatings", Science, Technology and Applications, Second Edition, pps. 253, 266–270, 275–278, 306.

* cited by examiner

Primary Examiner—Long Pham
Assistant Examiner—Nathan W. Ha
(74) Attorney, Agent, or Firm—TraskBritt

(57) ABSTRACT

Ta—Al—N is formed on a semiconductor device structure, such as a wiring line, to prevent interdiffusion between surrounding layers. The Ta—Al—N material may serve as a diffusion between two conductor layers, a semiconductor layer and a conductor layer, an insulator layer and a conductor layer, an insulator layer and a semiconductor layer, or two semiconductor layers. Another use is to promote adhesion of adjacent layers, such as between two conductor layers, a conductor layer and an insulator layer, a semiconductor layer and a conductor layer, or two semiconductor layers. The Ta—Al—N material also may be used to form a contact or electrode.

19 Claims, 3 Drawing Sheets

METHOD OF USING TANTALUM-ALUMINUM-NITROGEN MATERIAL AS DIFFUSION BARRIER AND ADHESION LAYER IN SEMICONDUCTOR DEVICES

CROSS-REFERENCE TO RELATED APPLICATIONS

This application is a continuation of U.S. patent application Ser. No. 09/207,058, filed Dec. 7, 1998, now U.S. Pat. No. 6,432,818, issued Aug. 13, 2002, which is a divisional of U.S. patent application Ser. No. 08/660,849, filed Jun. 10, 1996, now U.S. Pat. No. 5,892,281, issued Apr. 6, 1999.

BACKGROUND OF THE INVENTION

This invention relates to materials used in semiconductor device fabrication for interconnects, contacts, electrodes and other conductive applications. More particularly, this invention relates to materials having desirable interdiffusion barrier properties, desirable adhesion properties, and/or low contact resistances.

Semiconductor devices, also called integrated circuits, are mass produced by fabricating hundreds of identical circuit patterns on a single semiconductor wafer. During the process, the wafer is sawed into identical dies or "chips." Although commonly referred to as semiconductor devices, the devices are fabricated from various materials, including conductors (e.g., aluminum, tungsten), non-conductors e.g., silicon dioxide) and semiconductors (e.g., silicon). Silicon is the most commonly used semiconductor, and is used in either its single crystal or polycrystalline form. Polycrystalline silicon is often referred to as polysilicon, or simply "poly." The conductivity of the silicon is adjusted by adding impurities—a process commonly referred to as "doping."

Within an integrated circuit, thousands of devices (e.g., transistors, diodes, capacitors) are formed. These devices are formed by various fabrication processes, including doping processes, deposition processes, etching processes and other processes. Interconnects are formed to serve as wiring lines connecting the many devices. Contacts are formed where a device interfaces with other devices. Electrodes are formed for capacitors and other devices. Gate structures are formed for transistor devices. These interconnects, contacts, electrodes and gates are formed using conductive materials or alloys.

In forming interconnect stacks, for example, it is desirable to perform an annealing step to densify material formation and improve material properties. Often, such processes include exposing the wafer to elevated temperatures, such as 500° C. or higher. Exposure to these elevated temperatures may result in undesirable effects, such as interdiffusion of metals, morphology changes, melting or other undesirable reactions with adjacent materials. Incorporating alloys with aluminum, for example, is used to raise the melting point and reduce electromigration effects. However, even at a low temperature, such as 100° C., aluminum and silicon may react, interdiffusing with each other. Such interdiffusion alters the desired device properties, resulting in product defects. Accordingly, it is known to provide a barrier layer at a silicon/metal interface. Known barrier materials for such interfaces include titanium nitride (TiN), titanium-aluminum-nitride (Ti—Al—N), titanium-tungsten (TiW), tantalum-nitride (TaN), and other materials. Such barrier layers often are 100 to 1000 Å thick.

Conventional diffusion barriers such as TiN and TiW, while generally effective at lower temperatures such as room temperature, tend to fail at elevated temperatures. As many preferred semiconductor fabrication processes require elevated temperatures, these materials often prove unsatisfactory. As a result, the implemented diffusion barrier often limits the types of fabrication processes that can be performed. The Ti—Al—N material as disclosed in U.S. Pat. No. 5,231,306 is an improvement over the TiN and TiW materials, being more effective and being more thermally stable at elevated temperatures. Other barrier materials for preventing interdiffusion are also desirable.

Further, as more complex wiring line structures are implemented for decreasingly smaller line pitches, additional layers are being included. One difficulty in dealing with the smaller dimensions and the increasingly complex structures is promoting adhesion among the layers. Accordingly, there is a need for materials useful at decreasing line pitches having improved adhesion qualities.

BRIEF SUMMARY OF THE INVENTION

According to the invention, tantalum-aluminum-nitrogen ("Ta—Al—N") is deposited on a semiconductor wafer to define a portion of a contact, interconnect, gate or electrode. In various embodiments, the Ta—Al—N material serves as a diffusion barrier, promotes adhesion, or serves as a cap layer of an interconnect stack. In these and other embodiments, the alloy material is used for its desirable material properties at small dimensions and over varying and/or prolonged temperature ranges.

According to one aspect of the invention, the tantalum-aluminum-nitrogen serves as a diffusion barrier. In various embodiments, the Ta—Al—N material serves as a diffusion barrier between (i) two conductor layers, (ii) a semiconductor layer and a conductor layer, (iii) an insulator layer and a conductor layer, (iv) an insulator layer and a semiconductor layer, and (v) two semiconductor layers.

According to another aspect of the invention, the tantalum-aluminum-nitrogen promotes adhesion between adjacent layers. In various embodiments, the Ta—Al—N material promotes adhesion between (i) two conductor layers, (ii) a conductor layer and an insulator layer, (iii) a semiconductor layer and a conductor layer, and (iv) two semiconductor layers.

According to another aspect of the invention, the Ta—Al—N material includes respective atomic concentrations of aluminum, tantalum and nitrogen as follows: between 0.5% and 99.0% aluminum; between 0.5% and 99.0% tantalum; and between 0.5% and 99.0% nitrogen. According to preferred embodiments, the material includes an atomic concentration of aluminum between 1.0% and 35%, an atomic concentration of tantalum between 20% and 50%, and an atomic concentration of nitrogen between 20% and 60%. Exemplary thicknesses are between 50 and 6000 Å. In embodiments in which the material is used to define a contact or electrode structure, the thickness range extends up to approximately 2 microns.

According to another aspect of the invention, the tantalum and aluminum that are deposited to form part of a Ta—Al—N layer come from organometallic sources.

According to another aspect of the invention, the tantalum and aluminum that deposited using sputtering techniques.

According to various embodiments of the invention, the Ta—Al—N material serves as a diffusion barrier layer in a wiring line stack; a cap layer in a wiring line stack; a contact structure between a substrate or layer and a wiring line; an interface layer between a contact and a metallization layer; an electrode for a capacitor; and a layer in a device gate stack.

According to one advantage of the invention, the Ta—Al—N layer serves as an effective diffusion barrier at elevated temperatures for typical process times and at room temperatures for extended times. According to another advantage of the invention, the Ta—Al—N layer promotes adhesion with surrounding layers of the semiconductor device. According to another advantage of the invention, there are Ta—Al—N compounds which have better thermal stability than Ti—Al—N compounds. In addition, tantalum is less attractive to oxygen than titanium and, thus, forms less oxide molecules during compound (Ta—Al—N) formation and deposition as compared to Ti—Al—N. These and other aspects and advantages of the invention make Ta—Al—N an effective material for use in interconnects, contacts, gates and electrode structures formed on a substrate.

DETAILED DESCRIPTION OF THE INVENTION

Figure 1:
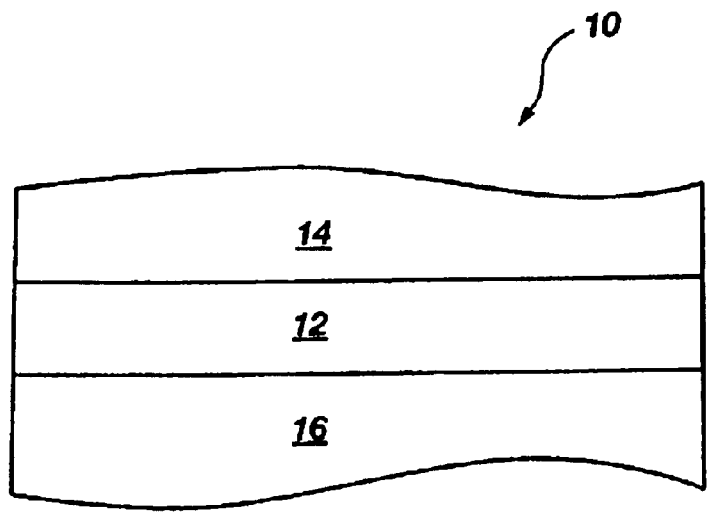
FIG. 1 is a cross-sectional diagram of an integrated circuit having a Ta—Al—N layer formed between adjacent layers according to an embodiment of this invention.

FIG. 1 shows a partial cross-sectional view of a semiconductor wafer 10 having a tantalum-aluminum-nitrogen (Ta—Al—N) layer 12 between two adjacent layers 14, 16 according to an embodiment of this invention. The Ta—Al—N layer 12 is a conductive alloy formed as a mixture and/or as a compound of tantalum, aluminum and nitrogen. The mixture need not be homogeneous at a microscopic scale. However, an admixture of the elements occurs throughout the Ta—Al—N layer 12.

The Ta—Al—N layer 12 has desirable properties for serving as a barrier layer, for serving as a wiring line cap layer, for promoting adhesion between adjacent layers, or for defining a contact or electrode. The adjacent layers 14, 16 are formed by any of conductive, non-conductive or semi-conductive materials. Typically, the Ta—Al—N layer 12 is between 50 Å and 6000 Å thick. The Ta—Al—N material includes respective atomic concentrations of aluminum, tantalum and nitrogen as follows: between 0.5% and 99.0% aluminum; between 0.5% and 99.0% tantalum; and between 0.5% and 99.0% nitrogen. According to preferred embodiments, the material includes an atomic concentration of aluminum between 1.0% and 35%, an atomic concentration of tantalum between 20% and 50%, and an atomic concentration of nitrogen between 20% and 60%.

With regard to embodiments in which the Ta—Al—N layer 12 is formed between a semiconductor layer 16 and a conductive layer 14, the semiconductor layer 16 is a silicon substrate, an area of silicon on the substrate, or a layer of silicon away from a silicon substrate. In various embodiments, the semiconductor layer 16 is formed by silicon, a silicon compound or another semiconductive material. In some embodiments, the semiconductor material is a lightly doped (e.g., p-type or n-type) single crystal of silicon having approximately 10 ohm-cm resistivity. The invention, however, also applies to other forms, doping levels and resistivity ranges. For conductive layer 14, the layer is formed by aluminum, copper, tungsten or another metal or metal alloy material.

Ta—Al—N as a Barrier Layer

Referring to FIG. 1, in one embodiment the Ta—Al—N layer 12 prevents interdiffusion between the adjacent layers 14 and 16. Absent a diffusion barrier, process steps performed at an elevated temperature cause a conductive layer 14 material to interdiffuse with a semiconductor underlayer 16. For example, during a deposition, reflow or annealing process step at a temperature such as 500° C., aluminum from conductive layer 14 adjacent to a silicon underlayer 16 will rapidly interdiffuse with the silicon. Even at a lower temperature, such as 100° C., the aluminum and silicon interdiffuse over time. Such interdiffusion changes the semiconductive properties of the underlayer 16 and changes the conductive properties of the conductive layer 14. The interdiffusion can also result in formation of interfacial compounds causing devices formed on the wafer to exhibit performance degradation. The presence of Ta—Al—N layer 12 between a silicon layer and aluminum layer substantially reduces (i) pitting of the silicon surface and (ii) intermixing between the silicon and aluminum.

Figure 2:
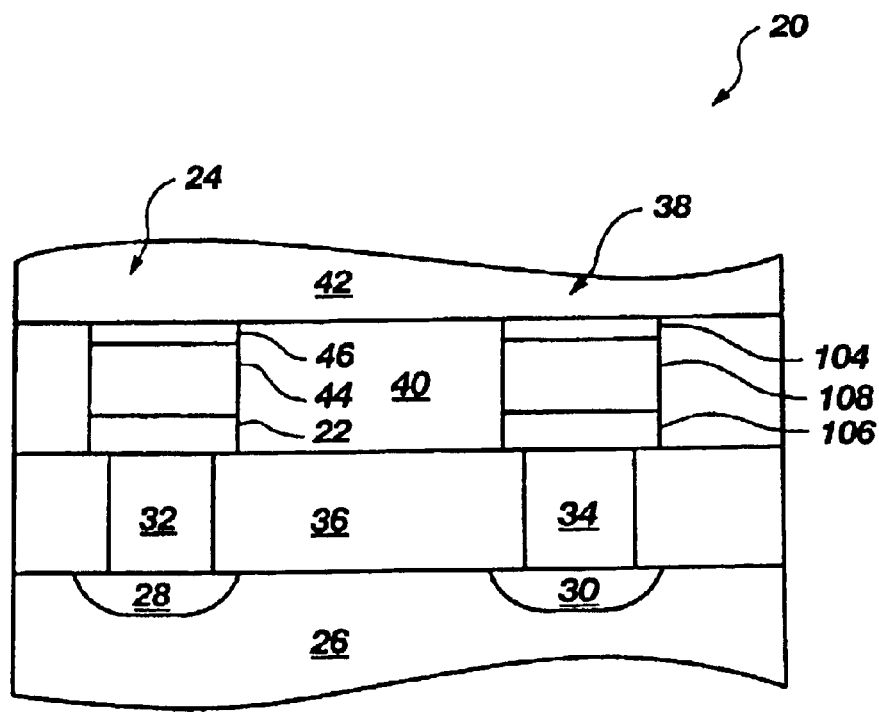
FIG. 2 is a cross-sectional diagram of an integrated circuit having an interconnect structure with a Ta—Al—N layer serving as a barrier layer according to an embodiment of this invention.

FIG. 2 shows a portion of an integrated circuit 20 in which a layer of Ta—Al—N serves as a barrier layer 22 within an interconnect or a wiring line stack 24. The integrated circuit 20 includes a substrate 26 in which one or more devices are formed. Shown are doped regions 28, 30. Contacts 32, 34 are formed in an oxide or other insulator layer 36 adjacent to the substrate 26. In other embodiments, the dielectric layer is formed adjacent to another intermediate layer on the substrate 26.

Interconnects or wiring line stacks 24, 38, are formed adjacent to the contacts 32, 34, respectively. The interconnects or wiring line stacks 24, 38 are surrounded by an adjacent insulating layer 40 or an extended dielectric layer 36. Another insulating layer 42 is deposited above the interconnects or wiring line stacks 24, 38.

The interconnect or wiring line stack 24 includes a barrier layer 22, a conductor layer 44 and a cap layer 46. According to an embodiment of this invention, the barrier layer is formed by a Ta—Al—N compound. The conductor layer typically is aluminum, although other metals such as copper are used in alternative embodiments. The cap layer 46 is deposited onto the conductor layer 44 and also serves as an anti-reflective coating during the photolithographic processes. The cap layer 46 also is formed by Ta—Al—N or another anti-reflective coating, such as titanium, titanium-aluminum or titanium-aluminum-nitrogen. Exemplary layer thicknesses are approximately 50 Å to 2000 Å for the barrier layer 22, 2000 Å to 15000 Å for the conductor layer 44 and 50 Å to 2000 Å for the cap layer 46. In various embodiments, the barrier layer 22 preferably is of uniform thickness within the range of 50 to 6000 Å. The invention, however, encompasses any thickness. In addition, the thickness may vary along a length of the barrier layer 22 as processes such as sputtering typically do not yield perfectly uniform topography.

Figure 3:
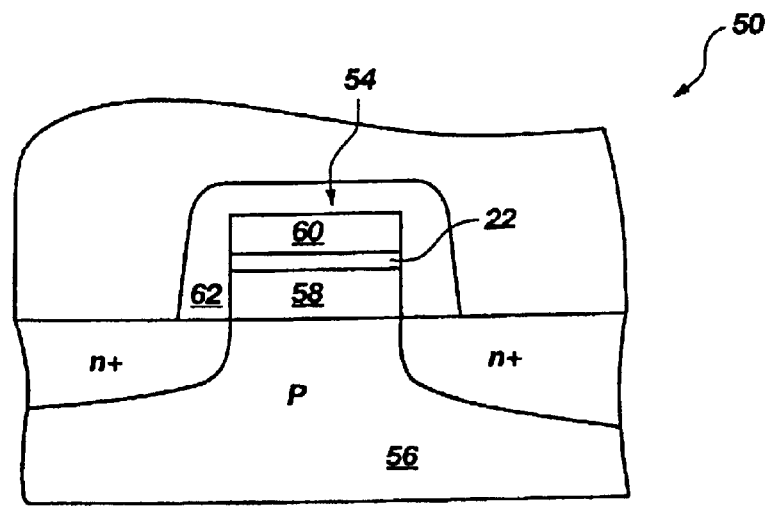
FIG. 3 is a cross-sectional diagram of an integrated circuit transistor having a Ta—Al—N layer in a gate stack according to an embodiment of this invention.

FIG. 3 shows a portion of an integrated circuit 50 in which a layer of Ta—Al—N serves as a barrier layer 22 within a gate stack 54 of a device formed in a substrate 56. An exemplary device including such a gate stack 54 is an MOS transistor, but other devices are also encompassed by the invention. The gate stack 54 includes a polysilicon layer 58 adjacent to the substrate 56. The barrier layer 22 is deposited onto the polysilicon layer 58. A conductive layer 60 is deposited onto the barrier layer 22. The conductive layer 60 is formed by aluminum, tungsten or another metal or metal alloy. An oxide or other dielectric material serves as a dielectric spacer 62 around the gate stack 54. One function of the barrier layer 22 is to prevent interdiffusion between the adjacent conductive material of the conductive layer 60 and the adjacent silicon material of the polysilicon layer 58. An exemplary layer thickness for the barrier layer 22 within the gate stack 54 is approximately 50 to 2000 Å. In various embodiments, the barrier layer 22 is preferably of uniform thickness within the range of 50 to 6000 Å. The thickness often varies along a length of the barrier layer 22, however, because processes such as sputtering typically do not yield perfectly uniform topography.

Referring again to FIG. 1, in another barrier layer embodiment, one layer is formed by an insulator material, such as silicon dioxide, another oxide material or a mixture of silicon with an oxide or other insulative material. The other layer is formed of a conductive material. Either the insulator layer or the conductive layer may be the upper layer 14 or the underlayer 16. The Ta—Al—N layer 12 serves as a barrier, preventing interdiffusion between the insulator layer and the conductive layer. The Ta—Al—N layer 12 preferably is between 50 and 6000 Å thick, although the invention encompasses other thicknesses as well.

In yet another alternative barrier layer embodiment, the layers 14, 16 are each formed by conductive materials or by semiconductive materials. Exemplary conductive layers 14, 16 are formed by aluminum, tungsten, platinum, copper or other metals or alloys. Exemplary semiconductive layers 14, 16 include silicon or gallium arsenide. For Ta—Al—N layer 12 between two conductive layers 14, 16, the Ta—Al—N layer 12 preferably is between 50 Å and 6000 Å thick, although the invention also encompasses other thicknesses.

In best mode embodiments of a Ta—Al—N barrier layer within an interconnect stack, the Ta—Al—N material includes 20–35% tantalum, 10–35% aluminum and 45–48% nitrogen. Such percentages are based upon atomic concentration. An exemplary embodiment includes approximately 35% tantalum, 20% aluminum and 45% nitrogen. The respective concentrations, however, may vary between 0.5% and 99.0% for each of tantalum, aluminum and nitrogen. According to preferred embodiments, the material includes an atomic concentration of aluminum between 1% and 35%, an atomic concentration of tantalum between 20% and 50%, and an atomic concentration of nitrogen between 20% and 60%.

Adhesion Promoting Embodiments

As integrated circuit elements formed on semiconductor wafers decrease in size, more circuitry is packed on each semiconductor chip. In addition, contacts and other interconnects are subject to higher aspect ratios, in which the layers are formed in deeper and narrower trenches and with smaller surface areas. As the surface areas of these layers get smaller, the adherement to adjacent layers tends to decrease. To assure that the layers remain attached and in physical communication relative to each other, it is desirable that the materials have desirable adhesion properties. It has been found that Ta—Al—N materials have desired bonding attributes at a microscopic level, and thus promote adhesion with adjacent layers. In particular, its adhesion properties are improved over prior materials used for interconnect layers, contacts and electrodes.

Figure 4:
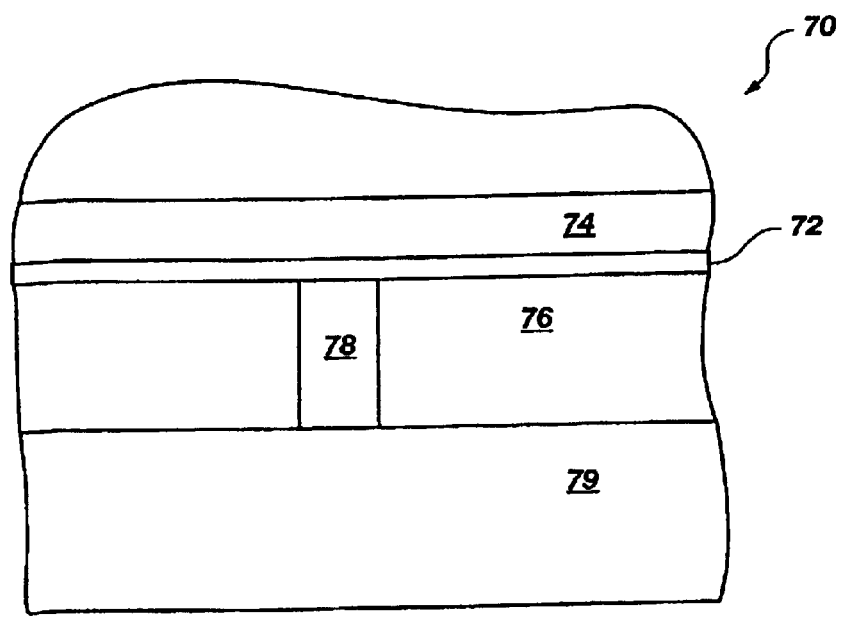
FIG. 4 is a cross-sectional diagram of an integrated circuit having a Ta—Al—N layer formed as an interface between a substrate and a metallization layer according to an embodiment of this invention.

FIG. 4 shows an integrated circuit 70 in which a layer 72 of Ta—Al—N promotes adhesion between an upper metallization layer 74 and an underlying oxide layer 76 and contact 78. Also shown is a substrate 79 in which various integrated circuit devices (not shown) are formed. The layer 72 also is useful as a barrier layer. In alternative embodiments, the Ta—Al—N layer 72 promotes adhesion between two adjacent semiconductor layers or between a semiconductive layer and a conductive layer. The Ta—Al—N layer 72 is preferably between 50 Å and 6000 Å thick, although the invention encompasses other thicknesses as well. For a Ta—Al—N layer 72 between the two semiconductive layers, the Ta—Al—N layer 72 is preferably between 500 Å and 6000 Å thick.

Additional Embodiments

Figure 5:
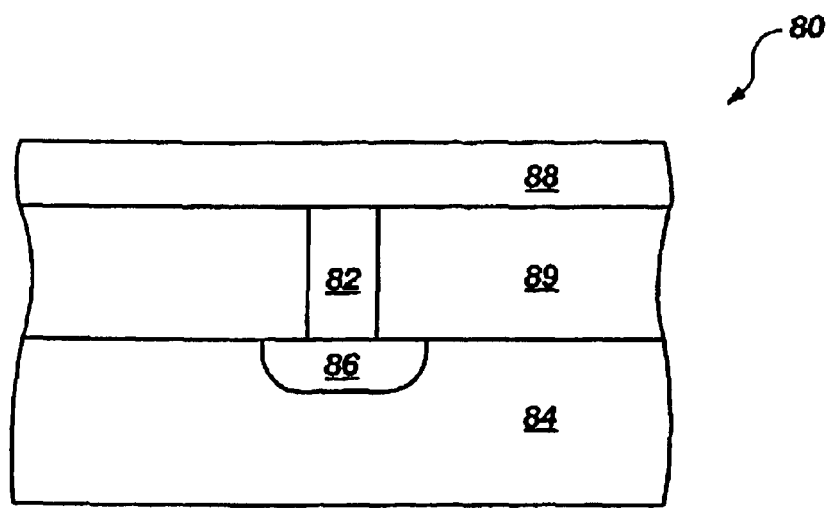
FIG. 5 is a cross-sectional diagram of an integrated circuit having a contact structure formed with Ta—Al—N according to an embodiment of this invention.

FIG. 5 shows an additional embodiment, in which Ta—Al—N is used to form a contact 82 in an integrated circuit 80. The Ta—Al—N material has low contact resistance, enabling the material to provide good electrical contact at one end to a doped region 86 of the substrate 84 and at another end to a metal line 88. In various configurations, the metal line is a metallization layer, a conductor layer of an interconnect, or a barrier layer of an interconnect. The contact 82 typically has a height of 50 Å to 20,000 Å.

Figure 6:
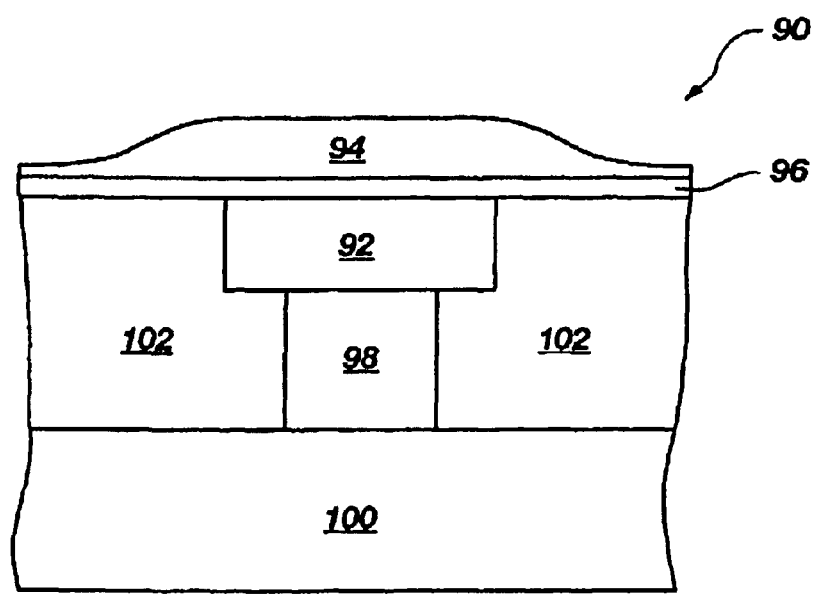
FIG. 6 is a cross-sectional diagram of an integrated circuit having a capacitor structure with a Ta—Al—N layer serving as a bottom electrode according to an embodiment of this invention.

FIG. 6 shows another embodiment, in which a Ta—Al—N layer serves as a bottom electrode 92 for a capacitor formed on an integrated circuit 90. The capacitor includes the bottom electrode 92, an upper electrode 94 and a dielectric 96. The dielectric 96 is located between the upper and bottom electrodes 94, 92. The capacitor also includes a contact 98 coupling the device to a semiconductor substrate 100. An insulating material 102 isolates the capacitor from the substrate 100 away from the contact 98. Typical thicknesses for the Ta—Al—N bottom electrode 92 range from 100 Å to 10,000 Å.

In still another embodiment, the Ta—Al—N material is deposited as a cap layer 104 for an interconnect or a wiring line stack 38 (see FIG. 2). The interconnect or wiring line stack 38 includes a barrier layer 106, a conductor layer 108 and the cap layer 104. The cap layer 104 has a thickness of approximately 50 Å to 2000 Å, and serves as an anti-reflective coating during photolithographic processes.

Material Deposition

In various embodiments, the Ta—Al—N layer is formed by a sputtering process, a chemical vapor deposition ("CVD") process (e.g., plasma-enhanced CVD; metalorganic CVD), or other semiconductor fabrication process. In a preferred embodiment, a tantalum-aluminum target is sputtered in an atmosphere including nitrogen during a reactive sputtering process. Exemplary gas sources for the nitrogen include $NH_3$ and $N_2$. To achieve a Ta—Al—N layer 12 including 35–37% tantalum, 15–20% aluminum and 45–48% nitrogen by atomic concentration, an atmosphere of approximately 30% nitrogen and 70% argon is provided. The gas is maintained at a pressure of 2 milliTorr, although in various process embodiments, the pressure is held constant at a pressure within the range of 0.5 to 10 milliTorr. The target is a pressed powder Ta—Al target including approximately 70% tantalum and 30% aluminum. In various embodiments, the target is of uniform composition, is a tantalum target having pockets of aluminum, or is an aluminum target having pockets of tantalum. The target is sputtered at a power of approximately 10 kilowatts onto a wafer maintained at approximately 150° C. to 250° C. (preferably 200° C.). The nitrogen reacts with the tantalum and aluminum coming off the target to form a layer of Ta—Al—N on the substrate. For a deposition time of approximately 50 seconds at a pressure of 2 milliTorr, a Ta—Al—N layer 12 approximately 1000 Å thick is achieved. Thinner or thicker layers are achieved by varying the deposition time. An exemplary Ta—Al—N compound formed as the Ta—Al—N layer 12 using these specific parameters includes 37% tantalum, 15% aluminum and 48% nitrogen by atomic weight. In an exemplary interconnect structure, the Ta—Al—N layer 12 is approximately 1% to 25% of the total interconnect structure thickness. Similar process parameters are used for sputtering a Ta—Al—N layer for an interconnect layer, contact, gate electrode, capacitor electrode, or other device embodiment. Although specific material concentrations are given for the target and vapor, such concentrations vary for depositing Ta—Al—N layers of differing concentrations (e.g., for preferred embodiments, an atomic concentration of aluminum between 1.0% and 20%, an atomic concentration of tantalum between 20% and 50%, and an atomic concentration of nitrogen between 20% and 60%; for other embodiments, an atomic concentration of aluminum between 0.5% and 99.0%, an atomic concentration of tantalum between 0.5% and 99.0%, and an atomic concentration of nitrogen between 0.5% and 99.0%).

Method of Manufacturing Devices Having Ta—Al—N

Referring to FIG. 1, a semiconductor device is manufactured in part by depositing the underlayer 16, Ta—Al—N layer 12 and upper conductive layer 14. Deposition processes for depositing the Ta—Al—N layer 12 are described above. The layers 14 and 16 are formed by a sputtering process, chemical vapor deposition process (e.g., plasma-enhanced CVD; metal-organic CVD) or other semiconductor fabrication process. Manufacturing steps for various embodiments are now described.

Referring to FIG. 2, an interconnect or a wiring line stack 24 is fabricated by depositing the layers 22, 44, 46 onto a contact 32 and dielectric layer 36. Prior to such deposition, the dielectric layer 36 is deposited. Using photolithographic and etching processes, a contact trench is formed within the dielectric layer 36. Conductive material is then deposited within the trench to define the contact 32. Next, a trench is defined for the interconnect or wiring line stack 24. First, photoresist is deposited onto the contact 32 and dielectric layer 36. Then the trench is defined within the photoresist using photolithographic and etching steps. The alloy barrier layer 22, followed by the conductor layer 44 and cap layer 46, are then deposited within the trench to form the interconnect or wiring line stack 24. A similar process is used to concurrently form interconnect or wiring line stack 38. Interconnect or wiring line stack 38, however, includes an alloy layer of tantalum, aluminum and nitrogen as a cap layer 104. In some embodiments, both the diffusion barrier layer 106 and cap layer 104 consist of tantalum, aluminum and nitrogen.

Referring to FIG. 3, the gate stack 54 is formed after the substrate 56 is doped to desired levels. First, photoresist is deposited onto the substrate 56 adjacent a desired doping region. Then a trench is defined within the deposited photoresist using photolithographic and etching steps. Next, a polysilicon layer 58 is deposited, followed by the alloy barrier layer 22, and conductor layer 60. A dielectric spacer layer 62 is then formed around the gate stack 54.

Referring to FIG. 4, an interface alloy layer 72 is formed between an oxide layer 76 and an upper layer 74 by depositing the alloy layer 72 onto the oxide layer 76 and contact 78. A chemical mechanical polishing ("CMP") step is then performed to smooth the alloy layer 72 to a desired thickness. The upper layer 74 is then deposited.

Referring to FIG. 5, a contact 82 formed of tantalum, aluminum and nitrogen is formed over a doped region 86 of a layer or substrate 84. First, an oxide layer 89 or other insulator layer is deposited onto the substrate 84. Next, a contact trench is formed using photolithographic and etching processes. The Ta—Al—N material is then deposited into the trench to form the contact 82. An upper layer from which metal line 88 is subsequently formed is then deposited over the contact 82 and oxide layer 89.

Referring to FIG. 6, a capacitor structure is formed in an integrated circuit 90. The capacitor includes the alloy bottom electrode 92, a dielectric 96 and an upper electrode 94. With a contact 98 previously formed in an oxide or other insulating material 102, photolithography and etching processes are used to define a trench for the bottom electrode 92. Once the trench is formed, the Ta—Al—N material is deposited. After smoothing the Ta—Al—N and insulating material 102 by chemical mechanical polishing or another process, the dielectric 96 is then deposited. The exposed dielectric is then smoothed using CMP or another process. Next, the upper electrode material is deposited. CMP and/or etching steps are used to define the upper electrode shape.

Meritorious and Advantageous Effects

One advantageous effect of the invention is that the Ta—Al—N layer serves as an effective diffusion barrier at elevated temperatures for extended times. Another advantageous effect is that the Ta—Al—N layer promotes adhesion with surrounding layers of the semiconductor wafer. In addition, tantalum is less attractive to oxygen than other metals, such as titanium. Thus, tantalum forms less oxide molecules during Ta—Al—N compound formation and deposition than, for example, Ti—Al—N compounds. The Ta—Al—N layer (i) prevents resistance degradation for conductors, (ii) avoids undesired precipitates, and (iii) allows a higher range of process temperatures. In addition, thinner layers can be used as diffusion barriers while maintaining the performance levels of adjacent materials.

The various devices and structures described above are applicable to various integrated circuits, including memory devices (e.g., static random access memory, dynamic random access memory, video random access memory, flash cells, processor circuits, logic arrays, logic gates and other digital circuitry). Although preferred embodiments of the invention have been illustrated and described, various alternatives, modifications and equivalents may be used. Therefore, the foregoing description should not be taken as limiting the scope of the inventions which are defined by the appended claims.

What is claimed is:

1. A method for fabricating a diffusion barrier in a semiconductor device structure, comprising:

forming an alloy comprising tantalum, aluminum, and nitrogen in contact with a first layer or structure of the semiconductor device structure; and forming a second layer or structure adjacent the alloy, the alloy being located between the first layer or structure and the second layer or structure so as to prevent diffusion of at least one of a material of the first layer or structure and another material of the second layer or structure substantially therethrough.

2. The method of claim 1, wherein forming the alloy comprises forming the alloy to include an atomic concentration of about 1% to about 35% aluminum.

3. The method of claim 1, wherein forming the alloy comprises forming the alloy to include an atomic concentration of about 20% to about 50% tantalum.

4. The method of claim 1, wherein forming the alloy comprises forming the alloy to include an atomic concentration of about 20% to about 60% nitrogen.

5. The method of claim 1, wherein forming the alloy comprises sputtering a target comprising aluminum and tantalum in an atmosphere comprising nitrogen.

6. The method of claim 5, wherein sputtering comprises sputtering a target comprising 25% to 35% aluminum and 65% to 75% tantalum, and in an atmosphere comprising 25% to 35% nitrogen at a pressure within the range of 0.5 to 10 milliTorr.

7. A method for adhering layers of a semiconductor device structure, comprising:
    forming an alloy comprising tantalum, aluminum, and nitrogen in contact with a layer or structure of the semiconductor device structure; and
    fabricating another layer or structure in contact with the alloy, at least one of the layer or structure and the another layer or structure comprising an insulative material, the another layer or structure comprising a material with poor adherence to a material of the layer or structure.

8. The method of claim 7, wherein fabricating the another layer or structure comprises fabricating the another layer or structure such that the alloy is positioned between the layer or structure and the another layer or structure so as to adhere the layer or structure and the another layer or structure to one another.

9. The method of claim 7, wherein fabricating the alloy comprises sputtering a target comprising tantalum and aluminum in the presence of nitrogen.

10. The method of claim 7, wherein at least one of the layer or structure and the another layer or structure comprises semiconductive material.

11. The method of claim 7, wherein at least one of the layer or structure and the another layer or structure comprises conductive material.

12. The method of claim 7, wherein forming the alloy comprises forming the alloy to have an average thickness of about 50 Å to about 6,000 Å.

13. A method for preventing interdiffusion between a material and another material, comprising:
    forming an alloy including tantalum, aluminum, and nitrogen in contact with the material; and
    forming a structure or layer comprising the another material in contact with the alloy, the alloy being disposed between the material and the another material so as to prevent diffusion of at least one material of the material and the another material into the other of the material and the another material.

14. The method of claim 13, wherein forming the alloy comprises sputtering a target comprising tantalum and aluminum in the presence of nitrogen.

15. The method of claim 14, wherein forming the alloy comprises forming the alloy in contact with silicon and wherein forming the structure or layer comprising the another material comprises fabricating an insulator structure or layer.

16. The method of claim 14, wherein forming the alloy comprises forming the alloy on an insulator.

17. The method of claim 14, wherein forming the alloy comprises forming the alloy with an atomic concentration of about 1% to about 35% aluminum.

18. The method of claim 14, wherein forming the alloy comprises forming the alloy with an atomic concentration of about 20% to about 50% tantalum.

19. The method of claim 14, wherein forming the alloy comprises forming the alloy with an atomic concentration of about 20% to about 60% nitrogen.

* * * * *

UNITED STATES PATENT AND TRADEMARK OFFICE
CERTIFICATE OF CORRECTION

PATENT NO. : 6,913,997 B2  Page 1 of 1
APPLICATION NO. : 10/213306
DATED : July 5, 2005
INVENTOR(S) : Salman Akram and Scott G. Meikle It is certified that error appears in the above-identified patent and that said Letters Patent is hereby corrected as shown below:

In the specification:
COLUMN 1, LINES 28-29, change "non-conductors e.g., silicon dioxide)" to --non-conductors (e.g., silicon dioxide)--
COLUMN 2, LINE 60, change "that deposited" to --that are deposited--

Signed and Sealed this

Sixth Day of November, 2007

JON W. DUDAS
*Director of the United States Patent and Trademark Office*